United States Patent
Unger

(10) Patent No.: US 6,777,960 B2
(45) Date of Patent: Aug. 17, 2004

(54) METHOD OF INFERRING THE EXISTENCE OF LIGHT BY MEANS OF A MEASUREMENT OF THE ELECTRICAL CHARACTERISTICS OF A NANOTUBE BOUND WITH A DYE, AND DETECTION ARRANGEMENT

(75) Inventor: Eugen Unger, Augsburg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/906,270

(22) Filed: Jul. 16, 2001

(65) Prior Publication Data

US 2002/0121891 A1 Sep. 5, 2002

(30) Foreign Application Priority Data

Jul. 20, 2000 (DE) .......................... 100 35 365

(51) Int. Cl.[7] .............................. G01R 27/08
(52) U.S. Cl. ....................................... 324/702
(58) Field of Search ................. 324/71.1, 702, 324/71.5, 71.6, 96, 414, 965, 751, 752, 753; 250/306, 423 R; 423/447.3; 435/6; 204/157.41

(56) References Cited

U.S. PATENT DOCUMENTS 5,773,834 A * 6/1998 Yamamoto et al. ...... 250/423 F
6,437,329 B1 * 8/2002 Yedur et al. ................ 250/306
6,528,020 B1 * 3/2003 Dai et al. ..................... 422/98

FOREIGN PATENT DOCUMENTS

WO   WO 97/33176   9/1997

OTHER PUBLICATIONS

A. Hirsch, The Chemistry of the Fullerenes, Georg Thieme Verlag, pp. 172–180, ISBN 3–13–136801–2.
J.F. Nierengarten et al., Synthesis of a $C_{60}$–oligophenylenevinylene hybrid and its incorporation in a photovoltaic device, Chem, Commun. pp. 617–618, Mar. 1999.
R. Müller Bauelemente der Halbleiter–Elektronik (Semiconductor electronics components), Springer Verlag, ISBN 3–540–06224–6, pp. 41–45, 1973.
P.M. Ajayan, Nanotubes from Carbon, Chem. Rev. 99, pp. 1787–1799, 1999.
W. Han, et al, Synthesis of Boron Nitride Nanotubes From Carbon Nanotubes by a Substitution Reaction, Applied Physics Letters, vol. 73, No. 21, pp. 3085–3087, Nov. 1998.
R. Martel et al, Single–and Multi–Wall Carbon Nanotube Field–Effect Transistors, Applied Physics Letters, vol. 73, No. 17, pp. 2447–2449, Oct. 1998.

* cited by examiner

Primary Examiner—Albert Decady
Assistant Examiner—James Kerveros
(74) Attorney, Agent, or Firm—Altera Law Group, LLC; Jeffrey R. Stone

(57) ABSTRACT

A method of inferring the existence of light by means of a measurement of the electrical characteristics of a nanotube bound to a dye first of all involves bringing a nanotube derivatized with a dye into contact with two conductor tracks. An electrical parameter of the nanotube is then measured via the two conductor tracks without exposure to light. Then the dye bound to the nanotube is irradiated, and the electrical parameter of the nanotube is then measured via the two conductor tracks with exposure to light. The difference between the value of the electrical parameter measured without exposure to light and the corresponding parameter measured with exposure to light is then established. Finally it is inferred, as a function of the difference established, whether light is present.

5 Claims, 3 Drawing Sheets

Measuring without light

Irradiation with light

Excitation of an electron

Delocalization of the excited electron; measuring

METHOD OF INFERRING THE EXISTENCE OF LIGHT BY MEANS OF A MEASUREMENT OF THE ELECTRICAL CHARACTERISTICS OF A NANOTUBE BOUND WITH A DYE, AND DETECTION ARRANGEMENT

BACKGROUND OF THE INVENTION

1. Field of the Invention

A method and apparatus for inferring the existence of light is disclosed. The method comprises measurement of the electrical characteristics of a nanotube bound with a dye.

2. Description of the Related Art

A photoelement is disclosed by [1]. The known photoelement is a photodiode which is usually implemented on the basis of silicon or another semiconducting material.

A drawback of such a photoelement, in particular, is its relatively low efficiency, caused by its relatively nigh electrical resistance, and its relatively large footprint on a chip, as a result of which the positional resolution in particular of a photoarray comprising such a photodiode is limited.

Also known from the prior art are carbon nanotubes [2]. A typical single-wall nanotube has a diameter of about 1 nm, the length of a nanotube possibly being a few hundred nanometers. Typically, the end of a nanotube is capped, i.e. covered, by half a fullerene molecule.

Carbon nanotubes are aromatic graphite-like structures. Their extended electron system renders the nanotubes electrically conductive, which suggests that the nanotubes are particularly suitable for the construction of nanocircuits. A number of fundamental experiments have demonstrated the controllability of this conductivity of the nanotubes. Hitherto, the diameter and the chirality of a nanotube have been thought to play an important part in the character of said conductivity.

It is further known to lower the conductivity by doping a carbon nanotube with boron nitride [3].

The conductivity can also be influenced by applying an electrical field to the nanotube (so-called field effect), as described in [4].

A nanotube coupled to a dye is disclosed by [5]. According to [5], the dye coupled to the nanotube is made to chemiluminescence either by the emission of light of a suitable wavelength or by applying an electrical potential which is sufficient to excite an electron present in the dye, on the basis of which chemiluminescence the presence of biomolecules likewise bound to the nanotubes can be detected.

In addition, [6] discloses chemical derivatization of $C_{60}$-fullerene molecules, and [7] discloses coupling of the latter to light-sensitive units.

Because of the growing interest in nanoswitching technology it is desirable to establish novel methods of utilizing the electrical characteristics of nanotubes.

BRIEF SUMMARY OF THE INVENTION

It is therefore an object of the invention to specify a further method of inferring the existence of light by means of a measurement of the electrical characteristics of a nanotube bound with a dye.

This object is achieved by a method of inferring the existence of light by means of a measurement of the electrical characteristics of a nanotube bound to a dye. A method of inferring the existence of light by means of a measurement of the electrical characteristics of a nanotube bound to a dye first of all involves bringing a nanotube derivatized with a dye into contact with two conductor tracks. An electrical parameter of the nanotube is then measured via the two conductor tracks without exposure to light. Then the dye bound to the nanotube is irradiated, and the electrical parameter of the nanotube is then measured via the two conductor tracks with exposure to light. The difference between the value of the electrical parameter measured without exposure to light and the corresponding parameter measured with exposure to light is then established. Finally it is inferred, as a function of the difference established, whether light is present.

Photoexcitable dyes have extended, delocalized orbital systems. Coupling such a photoexcitable dye to the nanotube ensures that an incident light quantum excites said extended orbital system of the dye in such a way that an electron present therein is promoted and delocalized throughout its orbital system. Owing to the higher energy imparted to the electron by the incident light quantum, and owing to the spatial proximity of the extended orbital system of the dye to the extended orbital system of the aromatic nanotube, the electron excited in the dye is now delocalized throughout the extended orbital system of the nanotube. Said delocalization of the excited electron throughout the extended orbital system of the nanotube therefore results in a change in the electrical characteristics of the nanotube, viz. its electrical conductivity.

Monitoring of the electrical characteristics of the nanotube thus derivatized therefore, according to the invention, allows the existence of light having a wavelength suitable for exciting an electron present in the dye to be established in the surroundings of the nanotube. This allows light quanta to be detected with very high sensitivity while maintaining a size suitable for the use of nanocircuits.

The inference of the existence of light can furthermore be performed quantitatively.

The electrical response can be a change in the conductivity, in the resistance, in the capacitance or in the inductance of the nanotube.

A photoelement includes at least one nanotube whose electronic characteristics can be controlled by exposure to light. Said photosensilization of a nanotube is achieved by a bond, preferably a covalent bond, to a dye.

Such a nanotube can be fabricated by means of a method in which, in a first step, the nanotube is derivatized by the generation of chemically reactive groups and, in a second step, a photoexcitable dye is coupled to the nanotube thus derivatized. According to one embodiment of the invention, derivatization is effected at one or both longitudinal ends of the nanotube.

This further facilitates derivatization, as the ends of a nanotube, in any case, are normally more reactive than the cylindrical surface of the nanotube.

The nanotube can be a carbon nanotube or a nanotube doped with boron nitride.

In addition, the derivatization may comprise an oxidation step.

According to a further embodiment of the invention, the step of oxidizing the nanotube is to be performed by reacting the nanotube with nitric acid, sulphuric acid, persulphuric acid, perhalic acids, organic peracids, or with combinations thereof or with halogen or interhalogens.

Furthermore, oxidation of the nanotube can be carried out at room temperature or at a temperature up to the boiling temperature of the respective solution or by irradiation of the nanotube in the presence of halogen or interhalogens.

The halogenated nanotube obtained by irradiation of the nanotube in the presence of halogen or interhalogens can, according to a further embodiment of the invention, then be converted into the corresponding carboxylated nanotube. Suitable for this purpose are, for example, (CO, $Co_2(CO)_8$, NaOH, h and $H^+$), (CO, $Ca(OH)_2$, MeOH, catalytic $PdCl_2(PPh_3)_2$), (CO, $H_2O$, n-$Bu_3N$, catalytic $PdCl_2(PPh_3)_2$) and/or ($CO_2$, catalytic Pd and electrolysis).

The derivatization can further comprise reaction of the carboxyl groups with a halogenating or water-eliminating reagent, thereby further continuing the derivatization process.

Examples of suitable halo-eliminating or water-eliminating reagents include $SOCl_2$, $COCl_2$, $PCl_3$, $PCl_5$, ($CCl_4$ and $Ph_3P$), PhCOCl, ClCOCOCl or $Cl_2$CHOMe, or carbodiimides or mineral acids.

According to a further embodiment of the invention, coupling is effected with a dye which includes a chemically reactive group which can enter a covalent bond with the carboxyl group or with the acyl chloride, the chemically reactive group of the dye not forming part of the dye's electron system responsible for the dye characteristics.

The dye derivative used can, for example, be aminofluorescein, a triphenylmethyl cation salt (trityl salt), a suitably derivatized porphine or hypericin.

A nanoelectric component includes at least one nanotube bound with a dye, preferably covalently bound, the electrical characteristics of the nanotube being controllable by shining light onto the one or more dye molecules.

Specific embodiments of the invention are shown in the figures and will be explained below in more detail.

DETAILED DESCRIPTION OF THE INVENTION

Figure 1A:
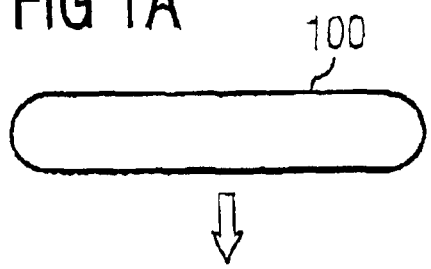
FIGS. 1a to 1d show a schematic depiction of a method according to a specific embodiment of the invention for derivatizing a nanotube by generating chemically reactive groups and for coupling a photoexcitable dye via the chemically reactive groups.

FIG. 1a shows a nanotube 100 in outline. The nanotube 100 is reacted with a reagent suitable for generating chemically reactive groups on the surface of the nanotube.

Figure 1B:
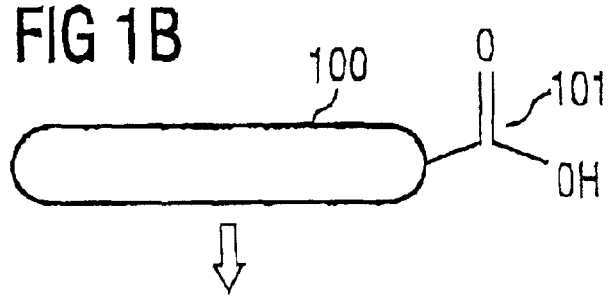

In the embodiment shown in FIG. 1b, the nanotube 100 is reacted with a strong acid, e.g. nitric acid, persulphuric acid, sulphuric acid, perhalic acids, organic peracids, or combinations thereof, so that the resulting chemically reactive group 101 is a carboxyl group.

Other radicals can, however, be used, e.g. halogen atoms, which can be bound to the nanotube by irradiation in the presence of halogen or interhalogen. The nanotube thus halogenated can then be converted into the corresponding carboxylated nanotube, for example via a reaction with (CO, $Co_2(CO)_8$, NaOH, h and $H^+$), (CO, $Ca(OH)_2$, MeOH, catalytic $PdCl_2(PPh_3)_2$), (CO, $H_2O$, n-$Bu_3N$, catalytic $PdCl_2(PPh_3)_2$) and/or ($CO_2$, catalytic Pd and electrolysis).

Even though the carboxyl group 101 in FIG. 1b is shown in a terminal position, it should be noted that the middle sections of the nanotube which are situated between the two ends can thus be derivatized too, despite the higher reactivity of the ends of the nanotube.

According to a further embodiment of the invention, the chemically reactive group 101 can, prior to coupling a photoexcitable dye, to promote said coupling be reacted with a known halogenating reagent or be activated by means of water-eliminating reagents.

In the case where the chemically reactive groups 101 generated oil the nanotube are carboxyl groups, preferred examples of possible halogenating or water-eliminating reagents include $SOCl_2$, $COCl_2$, $PCl_3$, $PCl_5$, ($CCl_4$ and $Ph_3P$), PhCOCl, ClCOCOCl or $Cl_2$CHOMe, or carbodiimides or mineral acids.

Figure 1C:
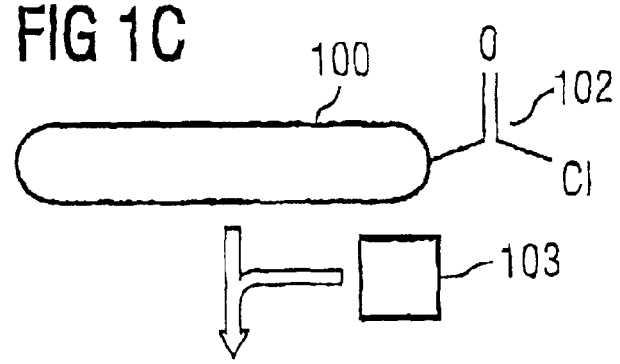

FIG. 1c shows the case where the carboxyl group 101 has been converted, by reaction with $SOCl_2$, $COCl_2$, $PCl_3$, $PCl_5$, ($CCl_4$ and $Ph_3P$), PhCOCl, ClCOCOCl or $Cl_2$CHOMe, into the corresponding acyl chloride group 102.

Figure 1D:
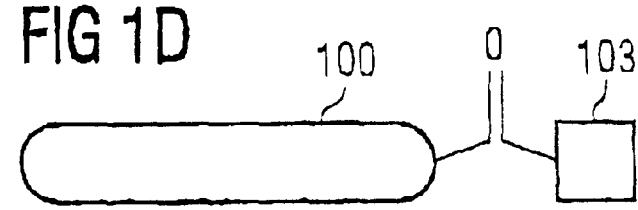

FIG. 1d shows the end product, i.e. the nanotube with the coupled dye 103.

Preferably, the dye 103 includes a nucleophilic group, for example an amino or hydroxyl group, via which coupling to the carbonyl carbon can be effected.

However, this group of the dye 103 used for coupling should not form part of the extended electron system, to ensure that coupling via this group will not change the excitability of this electron system by incident light.

Preferred as dyes 103 are, in particular, aminofluorescein, suitably derivatized porphine derivatives or hypericin.

Alternatively, the dyes used can be those without a nucleophilic group, if they have reactive electron pairs. Preferred examples of these are triphenylmethyl cation salts (so-called trityl salts), e.g. triphenylmethyllithium or triphenylmethylsodium. These can also be reacted directly with halogenated nanotubes without hydrolysis of the C—Cl bond.

Figure 2A:
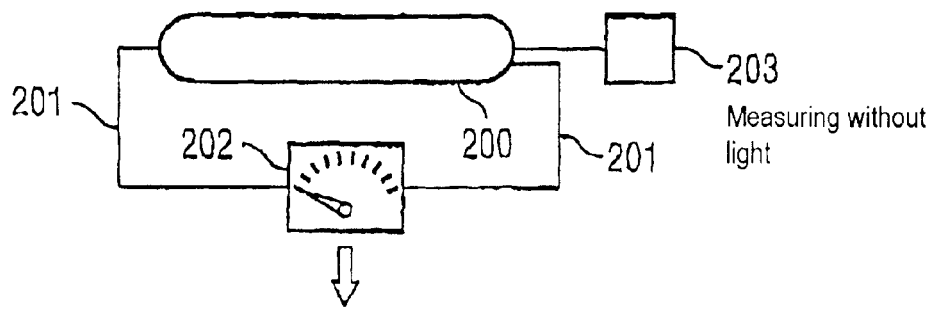
FIG. 2 shows a schematic depiction of a method of detecting light via the measurement of the electrical characteristics of a nanotube derivatized with a photoexcitable dye according to a specific embodiment of the invention. In the method shown, the nanotube coupled with the photoexcitable dye serves as a photoelement.

FIG. 2a shows a nanotube 200 fabricated according to the method and coupled to a dye 203, the nanotube being connected to an electrical measuring instrument 202 via two conductor tracks 201.

The electrical measuring instrument 202 is used for measuring the electrical characteristics of the nanotube 200.

Parameters actually measured for assessing the electrical characteristics of the nanotube 200 include, for example, the conductivity or its inverse, electrical resistance, the capacitance or the inductance of the nanotube 200.

FIG. 2a in addition schematically shows a second step in which the desired electrical parameter of the nanotube 200 is measured without the dye 203 being exposed to light.

Figure 2B:
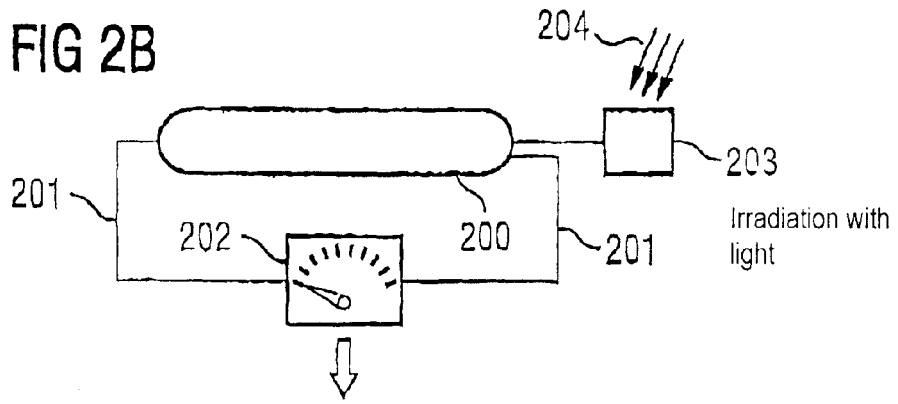

In FIG. 2b, the dye 203 is irradiated with a light quantum 204.

Figure 2C:
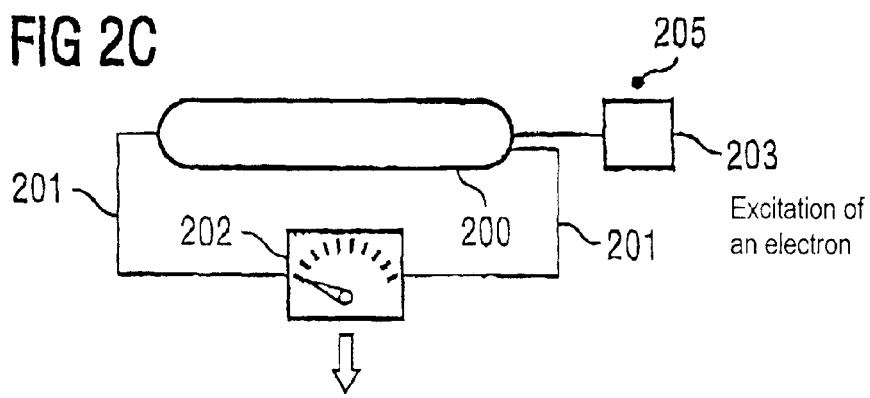

FIG. 2c schematically shows the case where the light quantum 204 from FIG. 2b has an energy suitable for exciting an electron in the extended electron system of the dye 203. The electron 205 thus excited is shown schematically as a point in FIG. 2c.

Figure 2D:
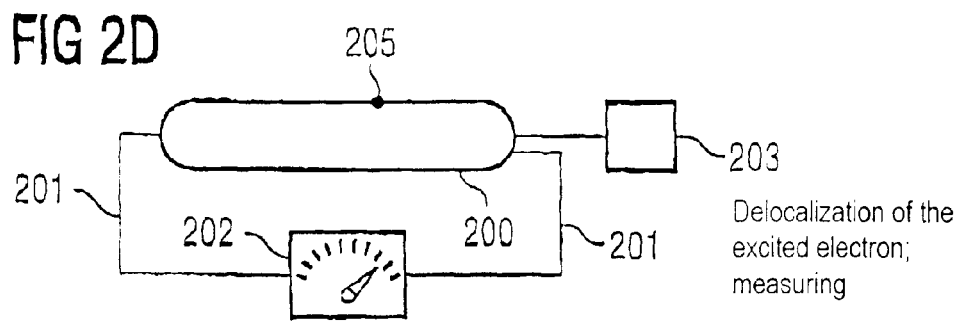

FIG. 2d shows the delocalization of this excited electron 205 throughout the extended electron system of the nanotube 200. Such delocalization is facilitated by the fact that the respective extended electron systems of the nanotube 200 and of the dye 203 overlap to some extent owing to their spatial proximity to one another.

In FIG. 2d, the change in the electrical characteristics of the nanotube, caused by the delocalization of the electron on the nanotube 200, is measured via the two conductor tracks 201 by the measuring instrument 202.

From an evaluation of the measurement results of the measuring instrument between the states shown in FIG. 2a and FIG. 2d, the change in the electrical characteristics of the nanotube can be inferred, in turn providing information on the existence of light of a wavelength suitable for excitation of the dye.

From the magnitude of the difference between the measurement results of FIG. 2a and FIG. 2d, the number of incident light quanta 204, i.e. the intensity of the light, can be inferred, the method thereby affording not only qualitative, but also quantitative information regarding the irradiated light.

Figure 3:
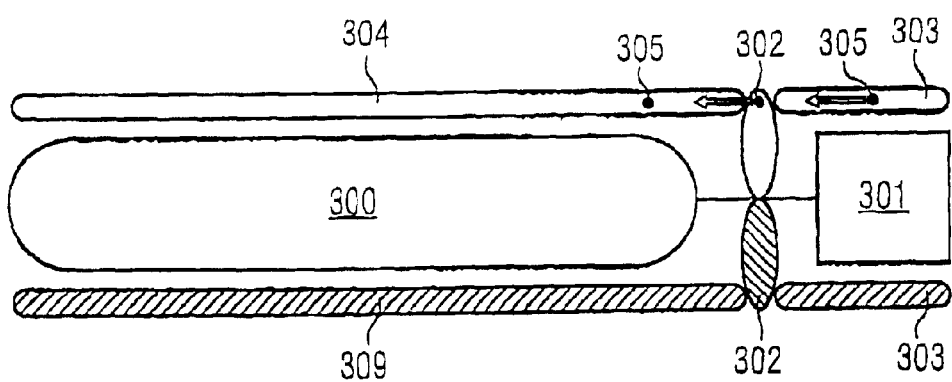
FIG. 3 is a schematic, enlarged depiction of an electron of the dye, said electron being delocalized in the extended electron system of the nanotube.

FIG. 3 schematically shows how an excited electron 305 of the dye 301, which, initially occupies the extended electron system 303 of the dye 301, is delocalized, via the electron system 302 of the carbonyl group which may be present, into the delocalized electron system 304 of the aromatic nanotube 300.

It should be noted that, in the case where a chemically reactive group other than a carboxyl group is used for coupling, the electron system 302 may not be present.

Even in this case, however, the spatial proximity of the electron systems 303 and 304 still ensures adequate delocalization of the electron excited in the dye 301 throughout the nanotube 300.

The following publications are cited in this document:

[1] R. Müller, Bauelemente der Halbleiter-Elektronik [Semiconductor electronics components], Springer Verlag, ISBN 3-540-06224-6, pp. 41–45, 1973.
[2] P. M. Ajayan, Nanotubes from Carbon, Chem. Rev. 99, pp. 1787–1799, 1999.
[3] W. Han et al, Synthesis of Boron Nitride Nanotubes From Carbon Nanotubes by a Substitution Reaction, Applied Physics Letters, Volume 73, Number 21, pp. 3085–3087, November 1998.
[4] R. Martel et al, Single- and Multi-Wall Carbon Nanotube Field-Effect Transistors, Applied Physics Letters, Volume 73, Number 17, pp. 2447–2449, October 1998.
[5] WO 97/33176.
[6] A. Hirsch, The Chemistry of Fullcrenes, Georg Thieme Verlag, ISBN 3-13-136801-2, pp. 172–181.
[7] J. -F. Nierengarten et al., Synthesis of a $C_{60}$-oligophenylenevinylene hybrid and its incorporation in a photovoltaic device, Chem. Commun. pp. 617–618, March 1999.

What is claimed is:

1. Method of inferring the existence of light by means of a measurement of the electrical characteristics of a nanotube bound to a dye, comprising the following steps of: bringing a nanotube derivatized with a dye into contact with two conductor tracks; measuring an electrical parameter of the nanotube via the two conductor tracks without exposure to light; irradiating the dye bound to the nanotube with light; measuring the electrical parameter of the nanotube via the two conductor tracks with exposure to light; establishing the difference between the value of the electrical parameter which was measured without exposure to light and the corresponding parameter which was measured with exposure to light; and inferring, as a function of the difference established, whether light is present.

2. Method according to claim 1, wherein the inference of the existence of light is performed quantitatively.

3. Method according to claim 1 or 2, wherein the electrical response is a change in conductivity, in resistance, in capacitance or in inductance.

4. Detection apparatus comprising a nanotube bound with a photoexcitable dye having an extended delocalized orbital system, where a device for measuring electrical characteristics of the nanotube is coupled to the nanotube.

5. A light detection apparatus comprising a nanotube bound with a photoexcitable dye having an extended delocalized orbital system, where a device for measuring electrical characteristics of the nanotube is coupled to the nanotube.

* * * * *

UNITED STATES PATENT AND TRADEMARK OFFICE
CERTIFICATE OF CORRECTION

PATENT NO. : 6,777,960 B2
DATED : August 17, 2004
INVENTOR(S) : Eugen Unger

It is certified that error appears in the above-identified patent and that said Letters Patent is hereby corrected as shown below:

Column 1,
Line 10, please delete "1."
Line 15, please delete "2."
Lines 46 and 49, please replace "chemiluminescene" with -- chemiluminesce --

Column 2,
Line 44, please replace "photosensilization" with -- photosensitization --

Column 3,
Line 15, please replace "halo-eliminating" with -- halogenating --

Column 4,
Line 17, please delete "oil" and replace with -- on --

Signed and Sealed this

Twenty-eighth Day of June, 2005

JON W. DUDAS
*Director of the United States Patent and Trademark Office*